United States Patent [19]

Nagel

[11] Patent Number: 5,525,825
[45] Date of Patent: Jun. 11, 1996

[54] MONOLITHIC INTEGRATED CIRCUIT WITH AT LEAST ONE CMOS FIELD-EFFECT TRANSISTOR AND ONE NPN BIPOLAR TRANSISTOR

[75] Inventor: Juergen Nagel, Freiburg, Germany

[73] Assignee: Deutsche ITT Industries GmbH, Germany

[21] Appl. No.: 371,756

[22] Filed: Jan. 12, 1995

Related U.S. Application Data

[62] Division of Ser. No. 206,066, Mar. 4, 1994, Pat. No. 5,411,900.

[51] Int. Cl.$^6$ ............... H01L 29/76; H01L 27/082; H01L 29/70
[52] U.S. Cl. ............... 257/370; 257/588; 257/592
[58] Field of Search ............... 257/370, 377, 257/378, 383, 384, 587, 588, 592

[56] References Cited

U.S. PATENT DOCUMENTS 4,475,279  10/1984  Gahle ................... 437/15 X
5,424,572  6/1995  Solheim ................. 257/370

FOREIGN PATENT DOCUMENTS 0325181  7/1989  European Pat. Off. ..
0375585  6/1990  European Pat. Off. ..

OTHER PUBLICATIONS

S. M. Sze; "Semiconductor Physics and Technology"; 1985; pp. 110–111.
"New CMOS Technologies" Solid State Devices 1980, pp. 114–117.
"A Single–Poly C–BiCMOS Process with Advanced ITLDD CMOS and Self–Aligned Vertical NPN, PNP devices" Technical Developments, Motorola, Inc., Jul. 1991.

*Primary Examiner*—Wael M. Fahmy
*Attorney, Agent, or Firm*—Plevy & Associates

[57] ABSTRACT

The invention relates to a method of making a monolithic integrated circuit with at least one CMOS field-effect transistor and one npn bipolar transistor wherein a thin oxide layer is covered with a protective polysilicon layer in both the bipolar-transistor area and the field-effect-transistor area.

5 Claims, 4 Drawing Sheets

MONOLITHIC INTEGRATED CIRCUIT WITH AT LEAST ONE CMOS FIELD-EFFECT TRANSISTOR AND ONE NPN BIPOLAR TRANSISTOR

This is a Division of application Ser. No. 08/206,066, filed Mar. 4, 1994 now Pat. No. 5,411,900.

This invention relates to semiconductor devices in general, and particularly to the formation of bipolar and complimentary metal oxide semiconductor (CMOS) devices on the same substrate.

BACKGROUND OF THE INVENTION

The development of hybrid bipolar/CMOS technologies is in many cases based on an existing CMOS process. Accordingly, a completely new concept of a hybrid technology is rare. In all cases, an economic compromise between transistor performance parameters and process complexity can be found.

In accordance with the multitude of possible applications, there is already a broad spectrum of BiCMOS processes, which differ significantly in their level of complexity. For instance, up to 25 mask levels may be necessary to implement vertical npn and pnp transistors together with CMOS devices in double-polysilicon technology.

Attempts have been made to limit the process complexity in the hybrid technologies, but to date, these methods have not proven very successful. For instance, if buried low-resistivity collector regions are used, this necessitates incorporating an epitaxial layer into the CMOS process, which is a cost-intensive and yield-reducing process step.

An article entitled "New CMOS Technologies", published in "*Solid-State Devices*", 1980, pages 114 to 117, discloses a method for making a monolithic integrated circuit with at least one pair of complementary Si-gate field-effect transistors and at least one planar npn bipolar transistor. In a thick oxide layer disposed on the substrate, openings are formed through which, using a mask against ion implantation, ions are locally implanted to choose the threshold voltage of the transistors and the field threshold voltage between the transistors. In addition to the steps used in the conventional Si-gate CMOS process, a further masking and implantation process is carried out to dope the base regions of the bipolar transistor. This implantation takes place through a thin oxide layer which is formed simultaneously with the thin oxide layers in the areas of the field-effect transistors. With respect to the bipolar transistor, the known method has the disadvantage of a compensated emitter. Furthermore, the bipolar transistor takes up considerable more space than the field-effect transistors.

The increased space requirement referred to above is mainly due to the necessary alignment tolerances. Both the alignment of the base region with respect to the collector contact and that of the emitter region with respect to the base are critical in the known method.

U.S. Pat. No. 4,475,279 to Gahle, entitled METHOD OF MAKING A MONOLITHIC INTEGRATED CIRCUIT COMPRISING AT LEAST ONE PAIR OF COMPLIMENTARY FIELD-EFFECT TRANSISTOR AND AT LEAST ONE BIPOLAR TRANSISTOR and assigned to ITY Industries, Inc. discloses a method for producing a monolithic integrated circuit having field effect transistors (FETs) and bipolar transistors. A space saving is achieved by dividing the opening of the bipolar transistor by means of a stripelike thin oxide layer. The method is advantageous in that it permits self-aligning and/or critical processes. A disadvantage of the method is the unpassivated gate oxide, which is easily damaged and contaminated. Moreover, additional photomasking steps are necessary to open the collector and emitter windows.

It is, therefore, an object of the invention to provide a modified method which reduces the number of manufacturing steps necessary to produce a Bi-CMOS transistor device. It is further an object of the present invention to provide a simplified manufacturing process in which the likelihood of damage and contamination to the integrated circuit devices is reduced.

SUMMARY OF THE INVENTION

The invention relates to a method of making a monolithic integrated circuit with at least one CMOS field-effect transistor and one npn bipolar transistor wherein a thin oxide layer is covered with a protective polysilicon layer in both the bipolar-transistor area and the field-effect-transistor area. The method comprises the steps of introducing an n-type well for the bipolar portion onto a p-type substrate and covering part of the surface of the substrate with a thick oxide layer. In areas where active transistor regions are to be formed, the substrate is covered with a thin oxide layer. The method next includes the steps of depositing a thin polysilicon layer on the oxide layers, then removing the polysilicon layer in the base area using a photoresist mask and implanting boron through the exposed thin oxide layer. In a further photomasking step, the emitter area and other areas adjacent the thick oxide layer are exposed. An n-type polysilicon layer is deposited over the entire surface, and subsequently the polysilicon layer is patterned, with the transition areas between the base and collector regions being exposed. Further steps include implanting boron to provide a low-resistivity connection between intrinsic and extrinsic base regions, then forming oxide spacers in a conventional manner and forming the base contact regions by boron implantation. Finally a titanium-silicide layer is produced where silicon and polysilicon are exposed.

BRIEF DESCRIPTION OF THE DRAWINGS

For a better understanding of the present invention, reference may be had to the following description of an exemplary embodiment thereof, considered in conjunction with the accompanying drawings, in which.

DETAILED DESCRIPTION OF THE DRAWINGS

Figure 1:
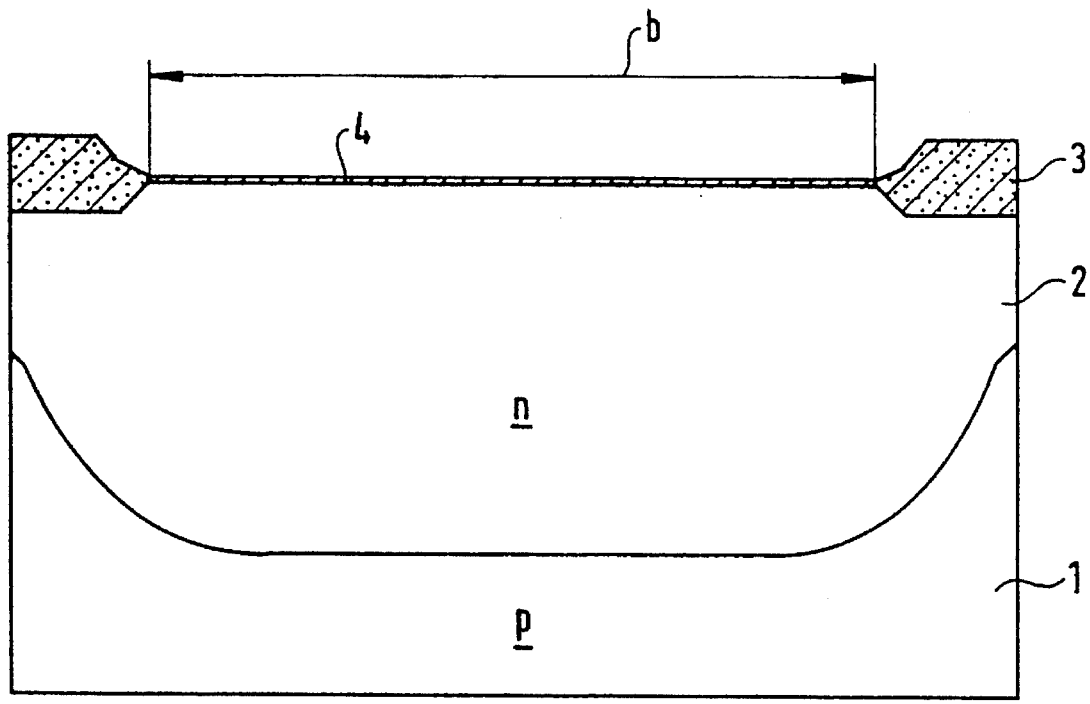
FIG. 1 shows application of thin and thick oxide layer in specific regions of the substrate.

Referring to FIG. 1, there is shown a p-type silicon substrate 1, wherein an n-type well 2 for the npn bipolar transistor is introduced into one surface of the substrate 1 in a conventional manner. This step may be performed simultaneously with the corresponding well formation for a p-channel field-effect transistor. A thick oxide layer 3 is thermally produced on the same surface with a suitable mask, leaving an area b uncovered where the regions of the transistor are to be formed. Simultaneously with the formation of the gate oxide for the field-effect transistors, the bipolar-semiconductor area b is covered with a thin oxide layer 4.

Figure 2:
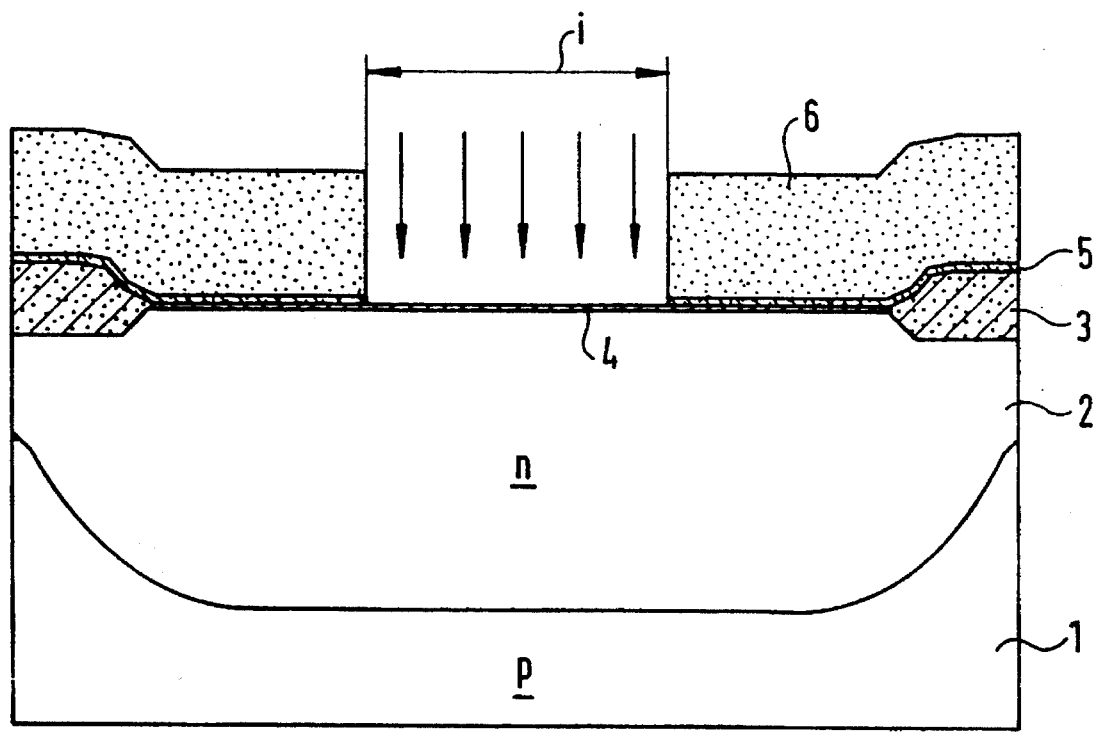
FIG. 2 shows application of a thin polysilicon layer along with a specially placed photo resist mask.

Referring to FIG. 2, a thin polysilicon layer 5 is applied over the entire surface of the oxide layer 3 and the area b shown in FIG. 1. Next, a photoresist mask 6 is applied in which a window i (base area) is opened by conventional means, so that the exposed polysilicon layer 5 can then be removed by dry etching. Through this window i, a medium dose of boron, approximately $1\times10^{13}/cm^2$, is then implanted through the remaining thin oxide layer 4 into the underlying n-type well 2.

Figure 3:
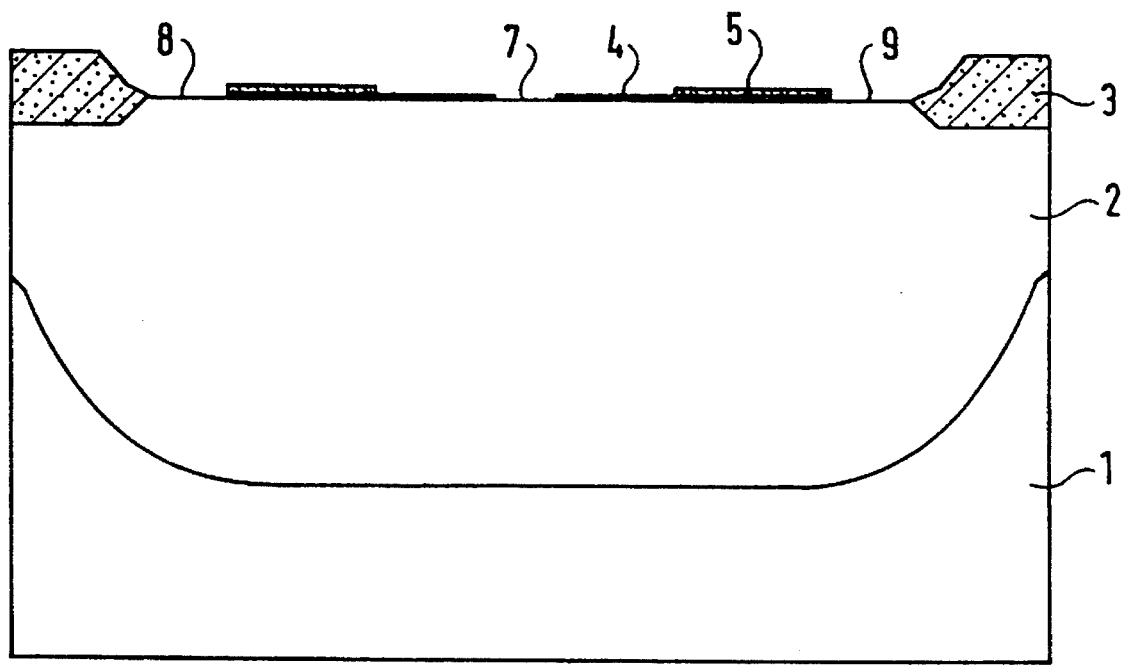
FIG. 3 represents specific etchings performed on the polysilicon layer.

Referring to FIG. 3, the photoresist mask 6 is removed in the next step. In a new photomasking step, a new mask is then formed. In a dry etch step, the exposed polysilicon 5 in the openings 8 and 9 is removed. Thereafter, the thin oxide layer 4 in the areas 7, 8, 9, is etched away by a hot etch technique. In the last step of this stage, the photoresist mask is removed, while in the field-effect-transistor area, the polysilicon layer 5 is left unpatterned.

Figure 4:
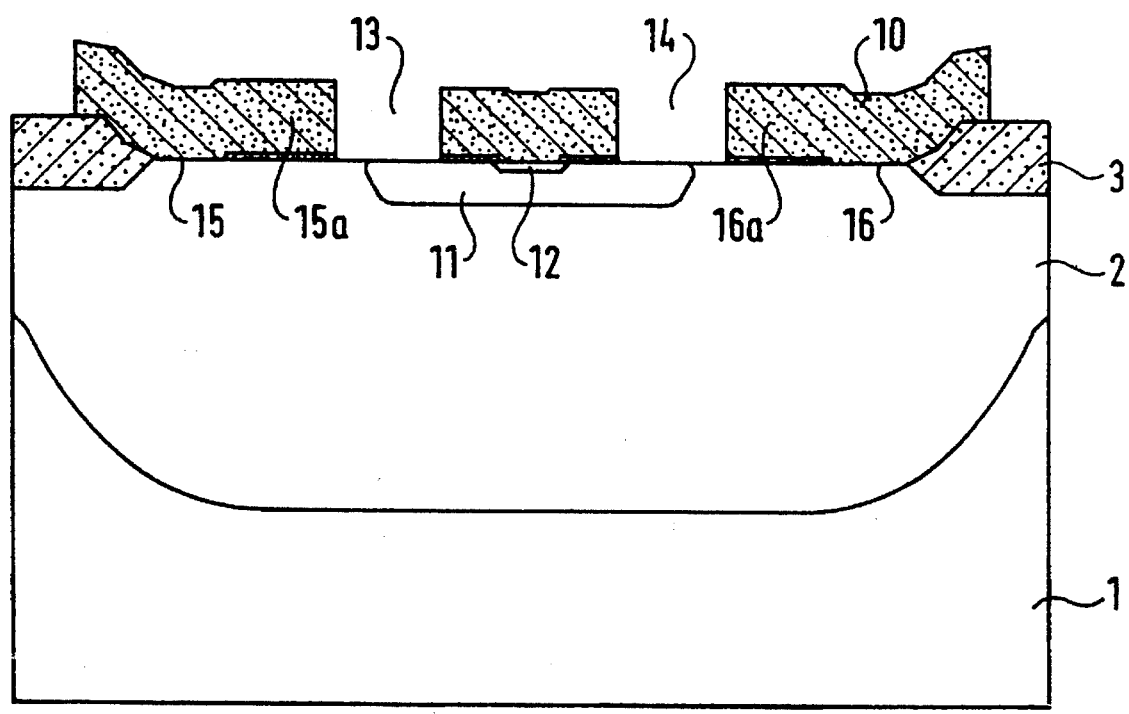
FIG. 4 demonstrates application of a polysilicon layer over selected regions of the substrate.

Referring to FIG. 4, a polysilicon layer 10 is deposited over the entire surface shown. The polysilicon layer 10 is doped n-type, and patterned in such a way as to overlap the edge areas of the thick oxide 3 and cover the substrate surface with the exception of the transition areas 13, 14 between the base and collector regions in the bipolar portion, and to form the gate in the field-effect-transistor area. In the bipolar transistor, overlapping portions 15a and 16a are thus formed. The thin oxide layer 4 exposed in the transition areas 13, 14 is removed by wet chemical etching. The polysilicon layer 10 serves as an emitter diffusion source and may be doped with arsenic or phosphorus.

Simultaneously with the subsequent diffusion of the emitter region 12, a high doping concentration is also achieved in the collector contact regions 15, 16 so that a low-resistivity contact is obtained. In this process step, the base region 11 is also formed as shown in FIG. 4.

Figure 5:
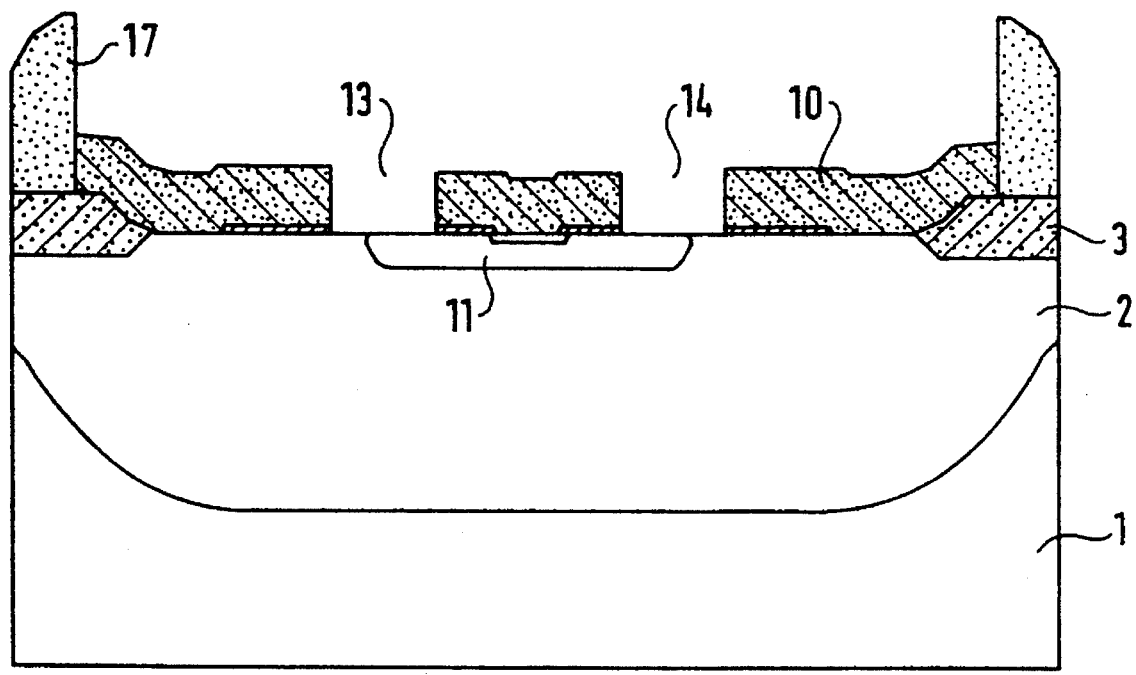
FIG. 5 shows the positioning of additional photoresist together masks in conjunction with &her process steps.

Referring to FIG. 5, with the use of a suitably patterned photoresist mask 17, a medium dose of boron ($1\times10^{14}/cm^2$) is implanted in the area of the bipolar transistor and in the area of the p-channel field-effect transistor to achieve a higher doping concentration in the base region.

Figure 6:
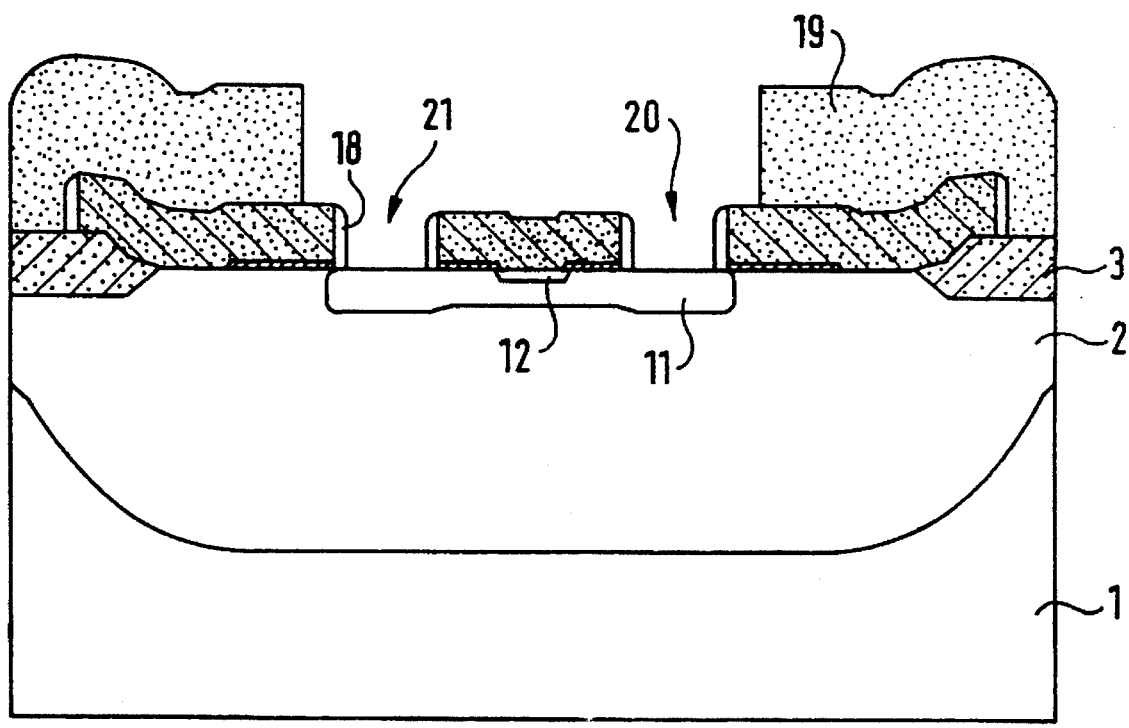
FIG. 6 shows the positions of oxide spacers and an additional photoresist mask in conjunction with other process steps.

In a next step, after removal of the photoresist mask 17, oxide spacers 18 are formed in the appropriate places in a conventional manner, as shown in FIG. 6. After deposition of a suitably patterned photoresist mask 19, a high dose of boron ions is implanted in the uncovered areas, namely into the base contact regions 20, 21 and into the source/drain regions of the p-channel field-effect transistor.

Figure 7:
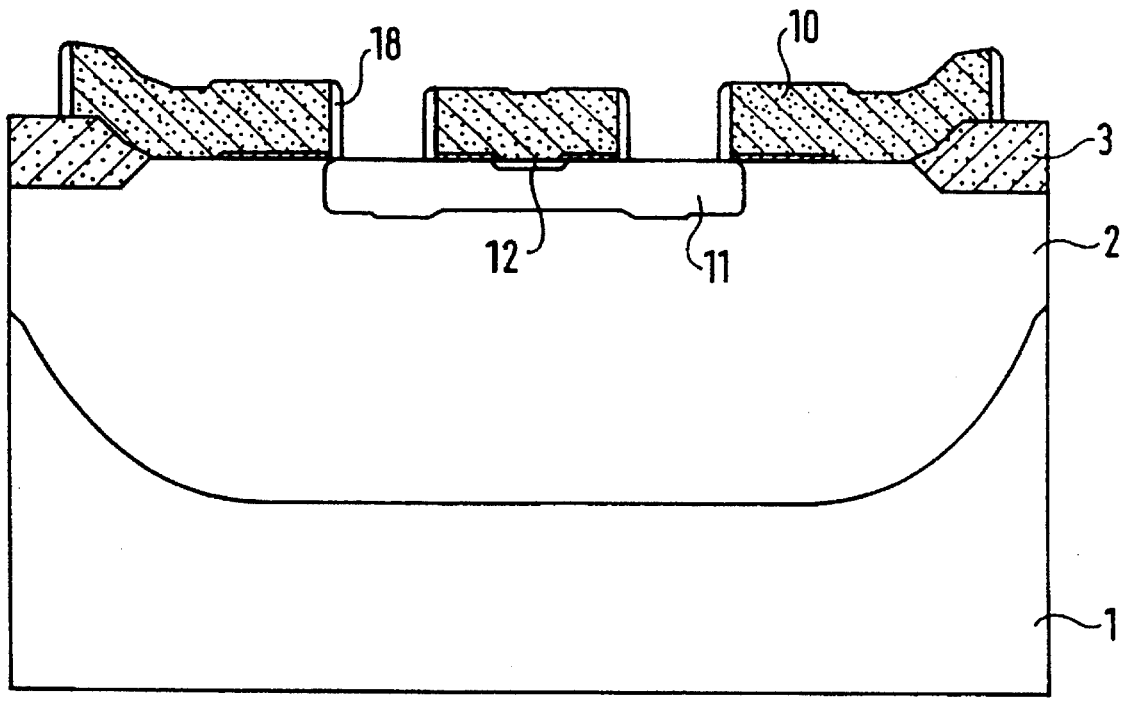
FIG. 7 demonstrates removal of the photoresist mask as shown in FIG. 6

Referring to FIG. 7, after removal of the photoresist mask 19, a new photoresist mask is applied which leaves only the n-channel portion of the field-effect-transistor area open. Arsenic is implanted, and an annealing step is then carried out to substantially define the base and emitter regions.

Figure 8:
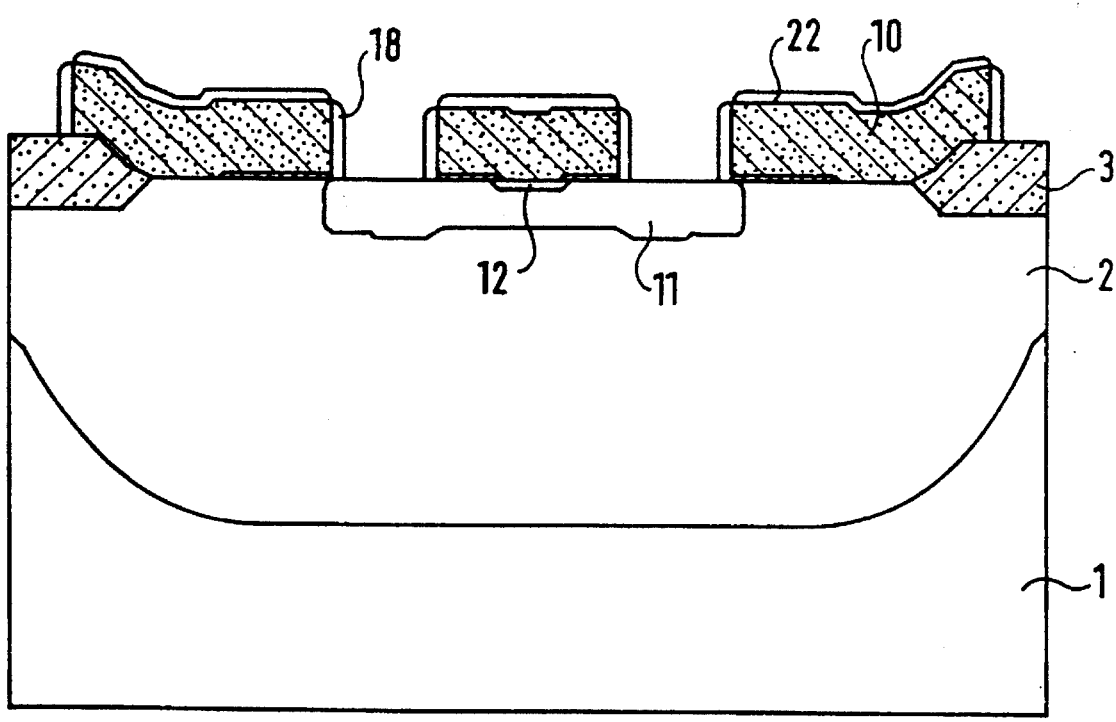
FIG. 8 shows the structure of the hybrid circuit produced according to the present invention.

Referring to FIG. 8, it can be seen that after removal of this photoresist mask, titanium silicide 22 is formed by the conventional, self-aligning Silicide process wherein silicon and polysilicon are exposed, i.e., both in the bipolar portion and in the CMOS portion as shown in the figure.

Referring to FIG. 8 in conjunction with FIG. 4, it can be seen that in the structure achieved by the method of the present invention, the overlapping portions 15a, 16a of the polysilicon layer and the adjoining oxide spacers 18 provide the necessary isolation between the highly doped contact regions of collector and base. The overlapping portions 15a, 16a can be scaled downward within the limits of the process-induced variations, which results in a compact bipolar component.

It will be understood that the present invention method of producing a monolithic Bi-CMOS devices as described herein is merely exemplary and that a person skilled in the art may make many variations and modifications to the described embodiments utilizing functionally equivalent method steps to those described. As such, variations and modifications, to the method stages and processes are intended to be the scope of the invention as described in the appended claims.

What is claimed is:

1. A monolithic integrated circuit having at least one pair of CMOS field-effect transistors and at least one planar bipolar transistor, comprising:

a substrate of a first conductivity having a well portion of a second conductivity extending into said substrate from a first surface thereof;

a base region extending into said well portion from said first surface;

an emitter area extending into said base region from said first surface;

a first patterned oxide layer covering selected areas of said base region and said emitter area;

a second patterned oxide layer having a thickness which is substantially greater than said first oxide layer, said second oxide layer having portions which are laterally separated from said base region by collector regions of said well portion;

a patterned polysilicon layer which defines transition areas between said base and said collector regions, said polysilicon layer having a portion disposed over said first oxide layer, wherein said first oxide layer electrically isolates said portion of said polysilicon layer from said transition areas; and a titanium-silicide layer selectively covering said polysilicon layer.

2. The monolithic integrated circuit of claim 1, wherein said first conductivity is n-type, said second conductivity is p-type and said bipolar transistor is npn.

3. The monolithic integrated circuit of claim 1, wherein said first conductivity is p-type, said second conductivity is n-type and said bipolar transistor is pnp.

4. The monolithic integrated circuit of claim 1, wherein said polysilicon layer is doped with arsenic.

5. The monolithic integrated circuit of claim 1, wherein said polysilicon layer is doped with phosphorous.

\* \* \* \* \*